(12) United States Patent
Wang (10) Patent No.: US 10,775,902 B2
(45) Date of Patent: Sep. 15, 2020

(54) STYLUS WITH GLASS COMPONENT

(71) Applicant: Apple Inc., Cupertino, CA (US)

(72) Inventor: Paul X. Wang, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/241,755

(22) Filed: Jan. 7, 2019

(65) Prior Publication Data

US 2020/0089341 A1 Mar. 19, 2020

Related U.S. Application Data

(60) Provisional application No. 62/733,511, filed on Sep. 19, 2018.

(51) Int. Cl.
| *G06F 3/0354* | (2013.01) |
| *G06F 3/044* | (2006.01) |
| *G06F 3/041* | (2006.01) |
| *H05K 5/02* | (2006.01) |
| *G06F 1/16* | (2006.01) |

(52) U.S. Cl.
CPC ........ *G06F 3/03545* (2013.01); *G06F 1/1683* (2013.01); *G06F 3/044* (2013.01); *G06F 3/0414* (2013.01); *H05K 5/0217* (2013.01)

(58) Field of Classification Search
CPC .... G06F 3/03545; G06F 3/0414; G06F 3/044; G06F 1/1683; H05K 5/0217; H01F 7/0252; H01F 7/0242
See application file for complete search history.

(56) References Cited

U.S. PATENT DOCUMENTS

| 8,947,379 | B2* | 2/2015 | Bakken | G06F 3/03545 |
| | | | | 178/19.01 |
| 9,063,693 | B2* | 6/2015 | Raken | G06F 1/1613 |
| 9,274,623 | B2* | 3/2016 | Lee | G06F 3/041 |
| 10,228,781 | B2* | 3/2019 | Mishalov | G06F 3/03545 |
| 10,532,601 | B2* | 1/2020 | Davies-Smith | B43K 24/026 |
| 2005/0180618 | A1* | 8/2005 | Black | G06F 3/03545 |
| | | | | 382/124 |
| 2014/0029182 | A1* | 1/2014 | Ashcraft | G06F 1/26 |
| | | | | 361/679.4 |
| 2015/0116286 | A1* | 4/2015 | Stewart | G06F 3/03545 |
| | | | | 345/179 |
| 2015/0277592 | A1* | 10/2015 | Nishigaki | H02J 50/10 |
| | | | | 345/173 |
| 2016/0282970 | A1* | 9/2016 | Evreinov | G06F 3/03545 |
| 2017/0267898 | A1* | 9/2017 | Singla | G06F 3/03545 |
| 2018/0024651 | A1* | 1/2018 | Haran | G06F 3/0383 |
| | | | | 345/179 |
| 2018/0053588 | A1* | 2/2018 | Barel | H01F 7/0252 |

* cited by examiner

*Primary Examiner* — Sardis F Azongha
(74) *Attorney, Agent, or Firm* — Morgan, Lewis & Bockius LLP (57) ABSTRACT

A stylus can be provided with a glass member that defines a portion of an outer periphery of the stylus. The glass member can facilitate detection of touch input with a capacitive touch sensor within the stylus. The glass member can further facilitate magnetic coupling with a host device and wireless charging from the host device. The glass member also provides a durable outer surface along a section of the stylus to reduce the effects of wear. The glass member can be provided in a variety of shapes and arrangements that offer aesthetic options and customization for personal preferences.

18 Claims, 10 Drawing Sheets

STYLUS WITH GLASS COMPONENT

CROSS-REFERENCE TO RELATED APPLICATIONS

This application claims the benefit of U.S. Provisional Application No. 62/733,511, entitled "STYLUS WITH GLASS COMPONENT," filed Sep. 19, 2018, the entirety of which is incorporated herein by reference.

TECHNICAL FIELD

The present description relates generally to input devices, and, more particularly, to a stylus for use with a touch screen of an electronic device.

BACKGROUND

A variety of handheld input devices exist for detecting input from a user during use. For example, a stylus can be utilized to provide input by contacting a touch panel of an electronic device. The touch panel may include a touch sensitive surface that, in response to detecting a touch event, generates a signal that can be processed and utilized by other components of the electronic device. A display component of the electronic device may display textual and/or graphical display elements representing selectable virtual buttons or icons, and the touch sensitive surface may allow a user to navigate the content displayed on the display screen. Typically, a user can move one or more input devices, such as a stylus, across the touch panel in a pattern that the device translates into an input command.

BRIEF DESCRIPTION OF THE DRAWINGS

Certain features of the subject technology are set forth in the appended claims. However, for purpose of explanation, several embodiments of the subject technology are set forth in the following figures.

DETAILED DESCRIPTION

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, it will be clear and apparent to those skilled in the art that the subject technology is not limited to the specific details set forth herein and may be practiced without these specific details. In some instances, well-known structures and components are shown in block diagram form in order to avoid obscuring the concepts of the subject technology.

Some electronic devices that include a display surface and/or a touch panel receive tactile input from a user. For example, a stylus can be utilized to provide input by contacting a touch panel of an electronic device. The touch panel may include a touch sensitive surface that, in response to detecting a touch event, generates a signal that can be processed and utilized by other components of the electronic device. A display component of the electronic device may display textual and/or graphical display elements representing selectable virtual buttons or icons, and the touch sensitive surface may allow a user to navigate the content displayed on the display screen. Typically, a user can move one or more input devices, such as a stylus, across the touch panel in a pattern that the device translates into an input command.

A housing of a stylus can define an outer surface thereof and include plastics or other materials that provide adequate rigidity while allowing wireless signals to be transmitted through the housing. A coating layer can be provided to harden the exterior surface of the housing. However, such coating layers can be uneven. Additionally, plastics and coating layers are generally porous and susceptible to infiltration by debris, especially when the stylus is frequently handled and contacting other surfaces.

In accordance with embodiments disclosed herein, a stylus can be provided with a glass member that defines a portion of an outer periphery of the stylus. The glass member can facilitate magnetic coupling with a host device and wireless charging from the host device. The glass member can also facilitate detection of touch input with a capacitive touch sensor within the stylus. The glass member also provides a durable outer surface along a section of the stylus to resist infiltration of debris and reduce the effects of wear. The glass member can be provided in a variety of shapes and arrangements that offer aesthetic options and customization for personal preferences.

These and other embodiments are discussed below with reference to FIGS. 1-20. However, those skilled in the art will readily appreciate that the detailed description given herein with respect to these Figures is for explanatory purposes only and should not be construed as limiting.

Figure 1:
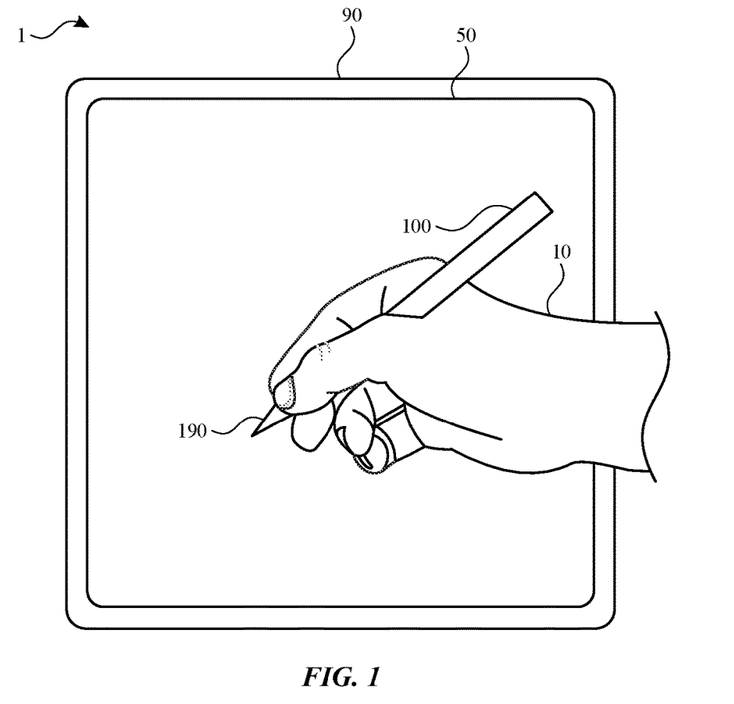
FIG. 1 illustrates a view of a system including a stylus and a host device, according to some embodiments of the subject technology.

A touch-based input device in accordance with embodiments disclosed herein can include any device that is held, worn, or contacted by a user for providing input and/or receiving feedback. The touch-based input device can be used alone or in conjunction with another device. For example, FIG. 1 illustrates a system 1 including a stylus 100 and a host device 90 having a surface 50, according to some embodiments of the subject technology. The stylus 100 can be held by a user 10 and operate as a touch-based input device for use with the host device 90.

The surface 50 of the host device 90 can include a display surface and/or a touch panel for interacting with the stylus 100 when contacted thereby. The host device 90 utilizes the display to render images to convey information to the user. The display can be configured to show text, colors, line drawings, photographs, animations, video, and the like. The surface 50 of the host device 90 can be implemented with any suitable technology, including, but not limited to, a multi-touch and/or multi-force sensing touchscreen that uses liquid crystal display technology, light-emitting diode technology, organic light-emitting display technology, organic electroluminescence technology, electronic ink, or another type of display technology or combination of display technology types.

The stylus 100 can include a tip 190 for contacting the surface 50. Such contact can be detected by the host device 90 and/or the stylus 100. For example, the stylus 100 can include one or more sensors that detect when the tip 190 contacts and applied pressure to the surface 50. Such sensors can include one or more contact sensors, capacitive sensors, touch sensors, cameras, piezoelectric sensors, pressure sensors, proximity sensors, electric field sensors, photodiodes, and/or other sensors operable to detect contact with the surface 50. Such sensors can optionally operate cooperatively with the host device 90 to detect contact with the surface 50.

Figure 2:
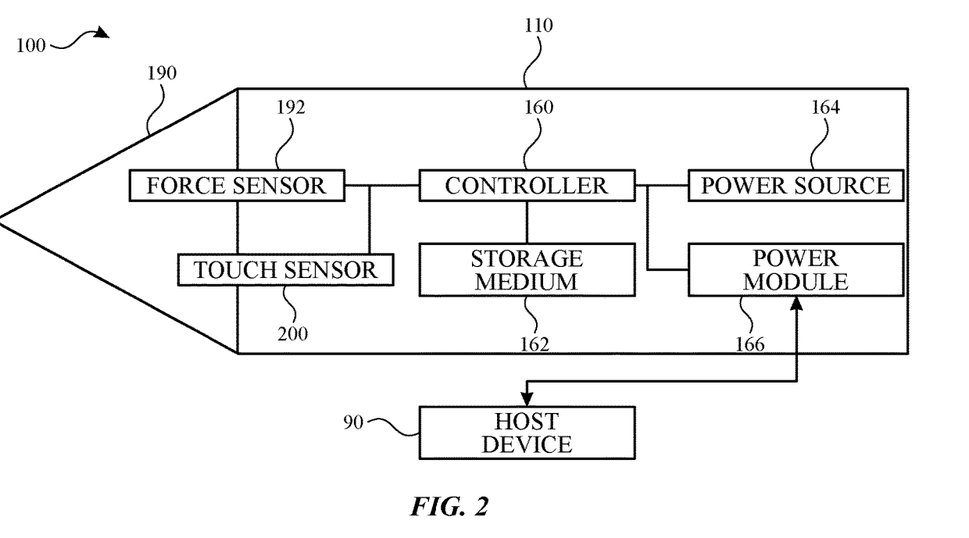
FIG. 2 illustrates a block diagram illustrating the stylus and the host device of FIG. 1, according to some embodiments of the subject technology.

As shown in FIG. 2, the stylus 100 can include components that support handling and operation by a user. Inputs can be provided by a user at one or more components of the stylus 100.

A force sensor 192 can be operated to detect user inputs at the tip 190 of the stylus 100. The force sensor 192 can interact with both the tip 190 and the housing 110 to detect relative motion of the tip 190 and the housing 110. For example, the force sensor 192 can be operated to detect when the tip 190 is contacting a surface, such as the surface of the host device 90. The detection can be based on movement of the tip 190 relative to the housing 110. Accordingly, the force sensor 192 can be directly or indirectly connected to both the tip 190 and the housing 110 to detect relative motion there between. The force sensor 192 can include a component that converts mechanical motion of the tip 190 into an electric signal. The force sensor 192 can include one or more contact sensors, capacitive sensors, touch sensors, strain gauges, cameras, piezoelectric sensors, pressure sensors, photodiodes, and/or other sensors. The force sensor 192 can detect both the presence and magnitude of a force.

In use, a user may manipulate the stylus 100 and apply a force to a surface of the host device 90. A corresponding reaction force may be transferred through the tip 190 of the stylus 100 connected to an electromechanical coupling and to the force sensor 192 of the stylus 100. The force sensor 192, or a portion thereof, may deform in response which may be measured and used to estimate the applied force. The force sensor 192 can be used to produce a non-binary output that corresponds to the applied force. For example, the force sensor 192 can be used to produce an output that represents a magnitude that varies in accordance with a variable amount of applied force.

A touch sensor 200 can be provided to detect contact by a user on a grip region of the housing 110 of the stylus 100. The touch sensor 200 can include a capacitive touch sensor, such as a self-capacitance sensor. As described further herein, the touch sensor 200 can include multiple sensing elements, such as conductive electrodes, to detect contact and changes in contact at multiple locations.

As further shown in FIG. 2, the stylus 100 can include a controller 160 and a non-transitory storage medium 162. The non-transitory storage medium 162 can include, for example, a magnetic storage medium, optical storage medium, magneto-optical storage medium, read-only memory, random access memory, erasable programmable memory, flash memory, or combinations thereof. According to some embodiments, the controller 160 can execute one or more instructions stored in the non-transitory storage medium 162 to perform one or more functions.

As further shown in FIG. 2, the stylus 100 can include a power source 164, such as one or more batteries and/or power management units. The stylus 100 can include components for charging the power source 164, such as a power module 166. The power module 166 can include one or more components for receiving and/or transmitting power wirelessly (e.g., inductively), for example from the host device 90.

The stylus 100 can include a communication component (not shown) for communicating with the host device 90 and/or another device. The communication component can include one or more wired or wireless components, WiFi components, near field communication components, Bluetooth components, and/or other communication components. The communication component can include one or more transmission elements, such as one or more antennas. Alternatively or in combination, the communication component can include an interface for a wired connection to the host device 90 and/or another device.

The stylus 100 can include other components including, but not limited to, displays, sensors, switches (e.g., dome switches), buttons, voice coils, and/or other components. The stylus 100 can detect environmental conditions and/or other aspects of the operating environment of the stylus 100 with an environmental sensor such as an ambient light sensor, proximity sensor, temperature sensor, barometric pressure sensor, moisture sensor, and the like. The stylus 100 can include a haptic feedback component that provides haptic feedback with tactile sensations to the user. The haptic feedback component can be implemented as any suitable device configured to provide force feedback, vibratory feedback, tactile sensations, and the like. For example, in one embodiment, the haptic feedback component may be implemented as a linear actuator configured to provide a punctuated haptic feedback, such as a tap or a knock. The stylus 100 can detect motion characteristics of the stylus 100 with a motion sensor such as an accelerometer, a gyroscope, a global positioning sensor, a tilt sensor, and so on for detecting movement and acceleration of the stylus 100. The stylus 100 can detect biological characteristics of the user manipulating the stylus with a biosensor that detects skin temperature, heart rate, respiration rate, blood oxygenation level, blood volume estimates, blood pressure, or a combination thereof. The stylus 100 can quantify or estimate a property of an object nearby or otherwise external to the stylus 100 with a utility sensor such as magnetic field sensors, electric field sensors, color meters, acoustic impedance sensors, pH level sensor, material detection sensor, and so on. Such data may be used to adjust or update the operation of the stylus 100 and/or may communicate such data to the host device 90 to adjust or update the operation thereof.

The host device 90 can also include components that facilitate operation of the stylus 100. For example, the host device 90 can include one or more of a processor, a memory, a power supply, one or more sensors, one or more communication interfaces, one or more data connectors, one or more power connectors, one or more input/output devices, such as a speaker, a rotary input device, a microphone, an on/off button, a mute button, a biometric sensor, a camera, a force and/or touch sensitive trackpad, and so on. In some embodiments, a communication interface of the host device 90 facilitates electronic communications between the host device 90 and the stylus 100.

As noted with respect to many embodiments described herein, a stylus configured to provide input capabilities and wireless charging may be constructed in a manner that facilitates these functions in a compact form. Generally and broadly, embodiments described herein provide touch sensing capabilities on an outer surface of the stylus, magnetic components for coupling to a host device, and wireless charging components for receiving power from the host device. One such example stylus is described below with reference to FIGS. 3 and 4. However, it may be appreciated that the generalized layout presented therein and described below are merely one example and that other embodiments can be implemented in different ways.

Figure 3:
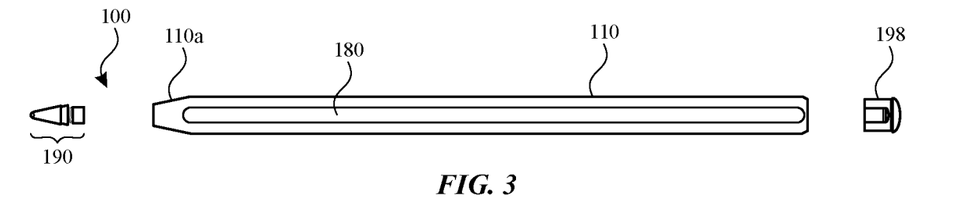
FIG. 3 illustrates an exploded view of various components and subsystems of a stylus.
Figure 4:
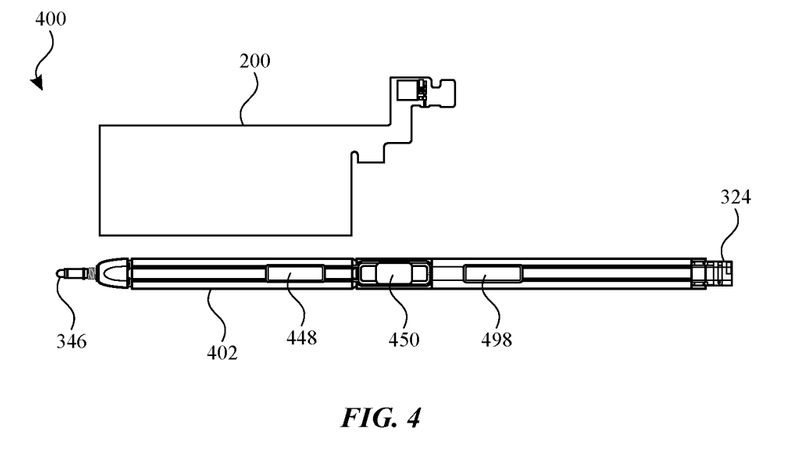
FIG. 4 illustrates an exploded view of various components and subsystems of the stylus of FIG. 3.

FIGS. 3 and 4 depict various components of a stylus 100 in exploded views. To facilitate an understanding of the interoperation and assembly of the various components of the stylus 100, FIGS. 3 and 4 are provided, showing an exploded view of the stylus 100 (e.g., FIG. 3) and an exploded view of internal components of the stylus 100 (e.g., FIG. 4).

Referring to FIG. 3, the stylus 100 of the illustrated embodiment includes a housing 110. The housing 110 is hollow. The housing 110 may take various forms to facilitate convenient, familiar, and comfortable manipulation or the stylus 100 by a user. In the illustrated example, the housing 110 has the general form of a writing instrument, such as a pen or a pencil. The housing 110 is generally cylindrical with a glass member 180 providing a flat exterior surface on a side thereof. The housing 110 can be formed from plastics, metals, ceramics, laminates, glass, sapphire, wood, leather, synthetic materials, or any other material or combination of materials. The glass member 180 can be formed from alumina silicate glass, soda lime, borosilicate, and the like, and combinations thereof.

The housing 110 can be configured to connect or be bonded to a cap 198 at an end of the housing 110. The cap 198 may be configured to provide a cosmetic end to the housing 110 of the stylus 100. The cap 198 forms a substantially continuous external surface with the housing 110 when attached to the housing 110. The cap 198 may be formed from any suitable material, such as, but not limited to, metal, plastic, glass, ceramic, sapphire, and the like or combinations thereof. In many cases, the cap 198 is formed from the same material as the housing 110, although this is not required. In some embodiments, the cap 198 may be configured, entirely or partially, as a signal diffuser to diffuse an infrared signal or another optical signal, such as a multi-color light-emitting diode. In other cases, the cap 198 may be configured, entirely or partially, as an antenna window, allowing for wireless communications and/or electric fields to pass there through.

In the illustrated embodiment, the housing 110 tapers at one end. The tapered end of the housing 110 is identified in the figure as the tapered end 110a. As illustrated, the tapered end 110a may be formed integrally with the housing 110. In other embodiments, the tapered end 110a is a separate piece from the housing 110. The glass member 180 can extend into the tapered end 110a. A tip 190 is partially disposed within the tapered end 110a. Other portions of the tip 190 are attached, either permanently or removably, to the end of the tapered end 110a from the exterior thereof. The tip 190 generally takes a conical shape, however such a shape is not required of all embodiments. The tip 190 may be configured to removably or permanently engage with a portion of a coordination engine assembly (described in detail below) disposed within the housing 110. The tip 190 may be configured to contact an input surface of an electronic device.

Referring now to FIG. 4, an internal assembly 400 can be provided for insertion into the housing 110 during assembly. The internal assembly 400 can assembled together before, during, or after at least partial insertion of components thereof into the housing 110. Insertion can be provided through an end of the housing that is subsequently covered with the cap 198. The tip 190 can be connected to the internal assembly through the tapered end 110a of the housing 110 after the internal assembly 400 is inserted and/or secured within the housing 110.

Referring now to FIG. 4, a wireless power receiver 450 can be provided within a frame 402. The wireless power receiver 450 can be positioned to avoid interference and/or blocking of wireless signals to the wireless power receiver 450. A front magnet 448 and a rear magnet 498 are positioned on opposite sides of the wireless power receiver 450.

The stylus 100 can include a touch sensor 200 for detecting touch input from a user. The touch sensor of FIG. 4 is shown in a flat configuration for purposes of illustration. It will be understood that, when assembled, the touch sensor 200 is wrapped about at least a portion of the frame 402, and the frame 402 with the touch sensor 200 is inserted into the housing 110. The touch sensor 200 can be a capacitive touch sensor that extends along at least a portion of a length of the stylus 100 when assembled. The touch sensor 200 can include multiple sensing elements distributed along the length and width thereof so that touch input can be detected at various locations when the stylus is assembled.

As further shown in FIG. 4, an antenna assembly 324 can be provided for wireless communication. The antenna assembly 324 can include an antenna that protrudes beyond an end of the frame 402 and is not covered by the frame 402. Additionally or alternatively, the antenna of the antenna assembly 324 can be aligned with a window in the frame 402.

The front assembly 410 can include a coordination engine assembly 346 for detecting force-based inputs at the tip 190, as discussed further herein. The coordination engine assembly 346 can be inserted within the frame 402. The coordination engine assembly 346 can include components for detecting forces and orientations of the stylus, such as a force-sensitive structure. In some embodiments, the force-sensitive structure includes an element that exhibits an electrically-measurable property that changes as a function of the magnitude of force applied. In one example, a strain-sensitive electrode may be coupled to a portion of the force-sensitive structure. In other embodiments, the deflection of the force-sensitive structure can be measured in another manner such as with, but not limited to: optical sensors; acoustic sensors; resonance sensors; piezoresistive sensors; and so on.

Figure 5:
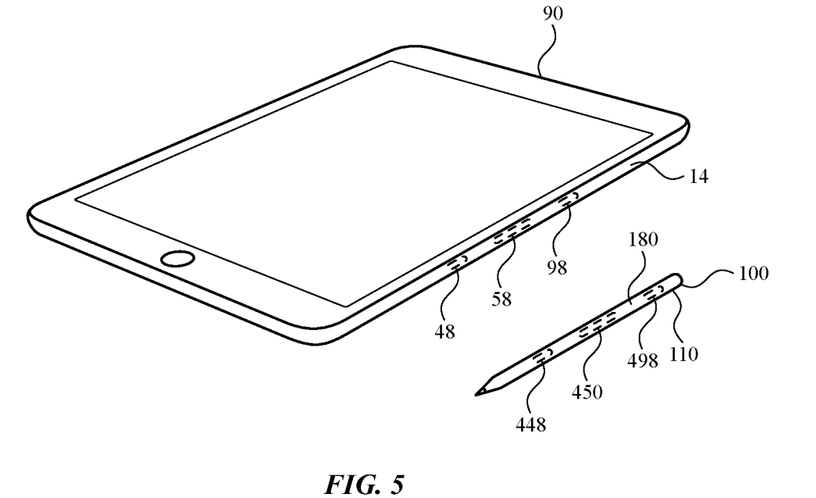
FIG. 5 illustrates a perspective view of a stylus and host device, according to some embodiments of the subject technology.
Figure 6:
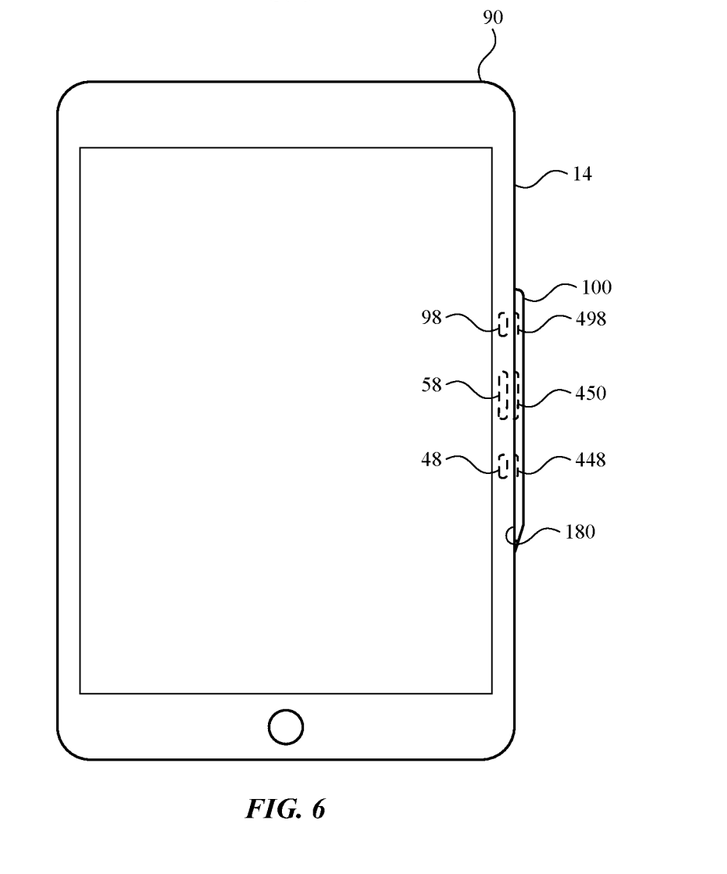
FIG. 6 illustrates a front view of a stylus and host device, according to some embodiments of the subject technology.

Referring now to FIGS. 5 and 6, use of the stylus with a host device can provide an interface for wireless charging for the stylus. As shown in FIG. 5, a wireless power receiver 450 within the housing of the stylus 100 and multiple stylus magnets 448 and 498 positioned on opposite sides of the wireless power receiver 450. The wireless power receiver 450 and the multiple stylus magnets 448 and 498 can be positioned on a same radial side of the stylus 100 as the glass member 180 so that magnetic coupling occurs on the side that is defined by the glass member 180. It will be understood that additional stylus magnets can optionally be included, and that the stylus magnets can be provided in other arrangements, such as on a same longitudinal side of the wireless power receiver 450.

The stylus magnets 448 and 498 provide magnetic coupling to corresponding host magnets 48 and 98 of the host device 90. As further shown in FIG. 5, a wireless power transmitter 58 is provided by the host device 90. The host magnets 48 and 98 can be positioned on opposite sides of the wireless power transmitter 58. The wireless power transmitter 58 and the host magnets 48 and 98 can be positioned so that, when the stylus magnets 448 and 498 are aligned with the host magnets 48 and 98, the wireless power receiver 450 is aligned with the wireless power receiver 450 of the host device 90. It will be understood that additional host magnets can optionally be included, and that the host magnets can be provided in other arrangements, such as on a same longitudinal side of the wireless power transmitter 58.

The magnetic coupling can maintain the alignment during a charging session. The glass member 180 can facilitate secure coupling to an engagement surface 14 of the host device 90. For example, the host device 90 can provide the engagement surface 14 with another flat surface or other complementary shape to facilitate physical contact of the opposing surfaces and maintain close proximity to the wireless power transmitter 58 and the wireless power receiver 450. It will be understood that other surface shapes and features are contemplated to facilitate contact and engagement of the stylus to the host device. For example, the surfaces (e.g., of the glass member 180 and/or the engagement surface 14 of the host device 90) can be flat, curved, concave, convex, undulating, stepped, tapered, or another shape to provide engagement.

The inclusion of the glass member 180 provides engagement with the host device and transmission of wireless power. Additionally, the glass member 180 provides a durable surface that is resistant to wear, scratching, and infiltration of debris. For example, the glass member 180 can provide a relatively rigid and non-porous surface that does not accept infiltration of debris occurring at the interface between the stylus 100 and the host device 90. As such, contact and rubbing occurring during coupling can resist degradation of the stylus at the glass member 180. This is particularly beneficial where the magnets are included in the stylus, as such magnets can attract metallic debris on the surface of the stylus, which may then be ground into the housing when contacting other surfaces, such as the host device. The glass member 180 can be located over the magnets and resist such infiltration, providing a more aesthetically pleasing appearance despite extensive use of the stylus. Additionally, the glass member 180 can be manufactured with precision to provide a shape and surface features that have fewer surface deviations than would occur with coating layers.

Figure 7:
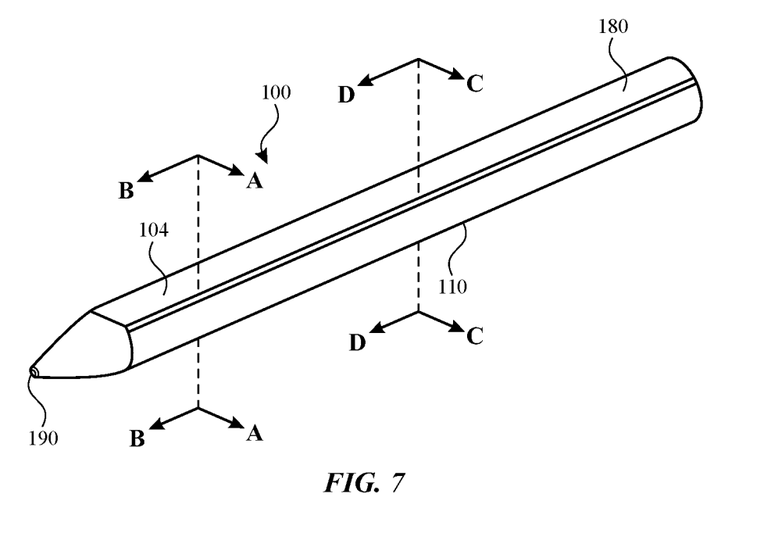
FIG. 7 illustrates a perspective view of a stylus, according to some embodiments of the subject technology.

Referring now to FIG. 7, the stylus 100 can support handling and operation by a user. In particular, the stylus 100 can receive inputs from a user at a location of the user's grip. FIG. 7 illustrates a stylus 100, according to some embodiments of the subject technology. According to some embodiments, for example as illustrated in FIG. 7, the stylus 100 can include a housing 110 and a glass member 180 that together provides an outermost cover along at least a portion of the length of the stylus 100. A user can grip the stylus 100 at a user grip region 104 during use of the stylus 100. The user grip region 104 can be located at a natural grip location, so that the user can provide inputs at the same location that is grasped during normal use of the stylus 100. For example, the user grip region 104 can be located an outer surface of the housing 110 and the glass member 180. The user grip region 104 can be near the tip 190 of the stylus 100. For example, the location of the user grip region 104 can be a distance from the tip 190 that is less than a half, a third, or a quarter of the total length of the stylus 100. At the user grip region 104, components of the stylus 100 can be positioned to receive tactile input from the user. For example, the user grip region 104 can be a portion of the housing 110. Alternatively or in combination, the user grip region 104 can include an input component set within the housing 110, such as a button, switch, knob, lever, and/or another input component. According to some embodiments, a marker can be provided (e.g., on the glass member 180) as an indicator for the location of the user grip region 104. The marker can be flush with neighboring portions of the outer surface, such that it can be seen but provide the same tactile features as other portions of the housing 110. Alternatively or in combination, the marker can provide a protrusion, recess, or texture that provides surface features that are different from adjacent portions of the housing 110.

Figure 8:
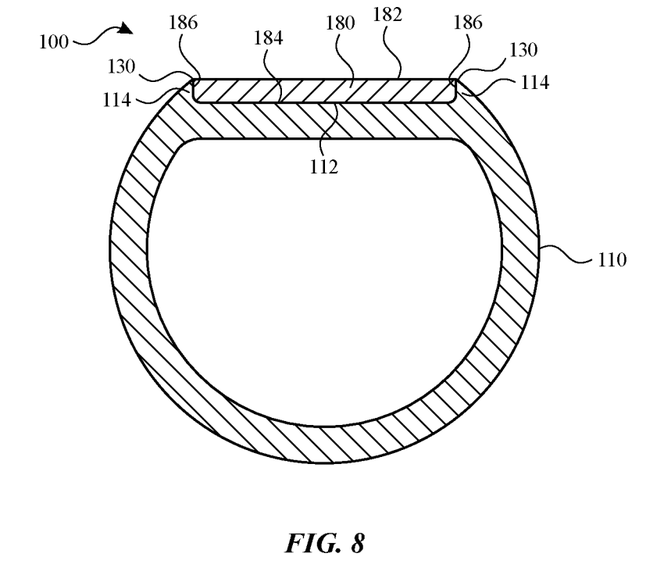
FIG. 8 illustrates a simplified front sectional view of the section B-B of an implementation of the stylus of FIG. 7, according to some embodiments of the subject technology.

Referring now to FIG. 8, the glass member can form a portion of an outer periphery of the stylus. For example, as shown in FIG. 8, the housing 110 can define, in cross-section, a continuously curved outer surface terminating in housing edges 130 at each of opposing shoulders 114 that are separated from each other. The glass member 180 can be positioned on a side of the housing 110, for example between the shoulders 114. While the housing 110 defines a curved outer periphery of the stylus 100, the glass member 180 can defined a flat outer periphery of the stylus 100. The flat portion of the glass member 180 can be used to stabilize the stylus 100 against another surface, such as a working surface, a host device, and/or a charging station, as discussed further herein. It will be understood that other surface shapes and features can be provided on the glass member 180 and/or the housing 110.

An outer surface 182 of the glass member 180 can be flush with the housing edges 130 where the outer surface of the housing 110 terminates and forms the shoulders 114. Accordingly, the glass member 180 can provide a smooth transition from its outer surface to the outer surface of the housing 110. While the cross-sectional shapes of the glass member 180 and the housing 110 can differ, the transition can be formed with neither item protruding radially beyond the other at the region of transition.

Where the glass member 180 is nested within the housing 110, sidewalls 186 of the glass member 180 can abut and/or oppose the shoulders 114 of the housing 110. An inner surface 184, opposite the outer surface 182, of the glass member 180 can abut and/or oppose a support surface 112 of the housing. The support surface 112 can extend between the base of each shoulder 114. The support surface 112 can have a shape that is complementary to the shape of the inner surface 184 of the glass member 180.

One of more aesthetic features can be provided to enhance the visual appearance of the stylus. For example, a visual feature can be provided on the glass member 180 and/or the housing 110 for viewing through the glass member 180. Such visual features can include one or more of a coating, printing, paint, ink, design, etching, carving, deposited material, or other viewable feature. Such visual features can be provided on a surface of the glass member 180 and/or the housing 110. For example, a visual feature can be provided on the outer surface 182, the inner surface 184, and/or the sidewalls 186 of the glass member 180. By further example, a visual feature can be provided on the shoulders 114 and/or the support surface 112 of the housing 110. Such features can be viewed through the glass member 180. Furthermore, such features can be protected from wear and damage by the glass member 180.

Figure 9:
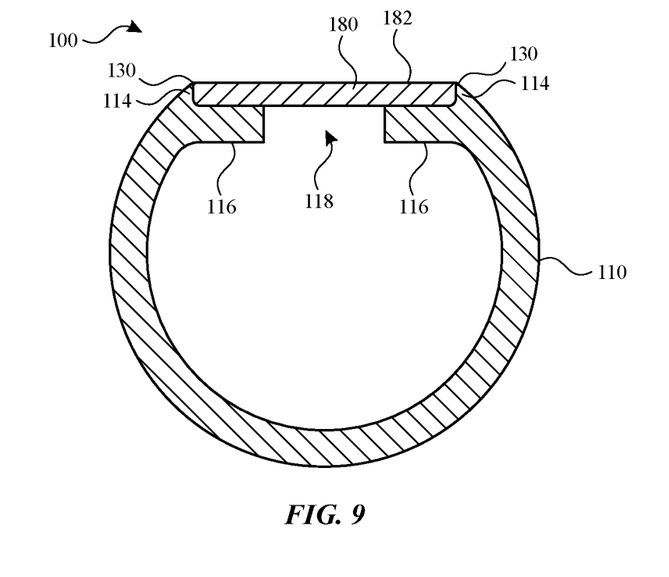
FIG. 9 illustrates a simplified front sectional view of the section B-B of another implementation of the stylus of FIG. 7, according to some embodiments of the subject technology.

Referring now to FIG. 9, the glass member can be positioned over a gap in the housing. For example, as shown in FIG. 9, the housing 110 can include ledges 116 that extend toward each other and define a gap 118 there between. It will be understood that the ledges 116 can be separate portions of a continuous ledge that extends about the gap 118. The glass member 180 can be positioned on the ledges 116 and above the gap 118. The glass member 180 can provide a view to components within the housing 110. Additionally or alternatively, the glass member 180 can include one or more visual features that obscure a view to components within the housing 110. As shown in FIG. 9, the glass member 180 can be nested within the housing 110, with an outer surface 182 of the glass member 180 being flush with the housing edges 130 where the outer surface of the housing 110 terminates and forms the shoulders 114.

Figure 10:
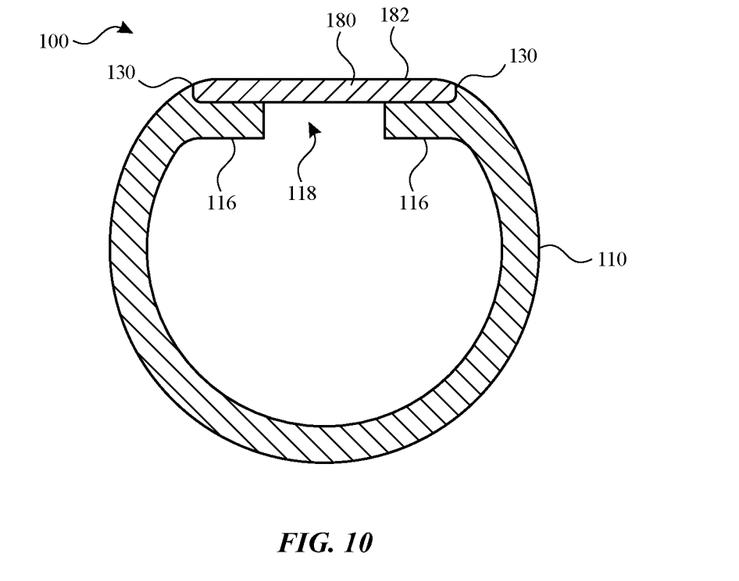
FIG. 10 illustrates a simplified front sectional view of the section B-B of another implementation of the stylus of FIG. 7, according to some embodiments of the subject technology.

Referring now to FIG. 10, the glass member can rest on a top surface of the housing. For example, as shown in FIG. 10, the housing 110 can include ledges 116 that extend toward each other and define a gap 118 there between. The glass member 180 can be positioned on the ledges 116 and above the gap 118. As shown in FIG. 10, the glass member 180 need not be nested within the housing 110. The outer surface 182 of the glass member 180 can be flush with the housing edges 130 formed at a transition to the ledges 116. The curvature of the outer surface 182 of the glass member 180 can match the curvature of the housing 110 at the housing edges 130. Elsewhere, the outer surface 182 of the glass member 180 can be planar or flat.

Figure 11:
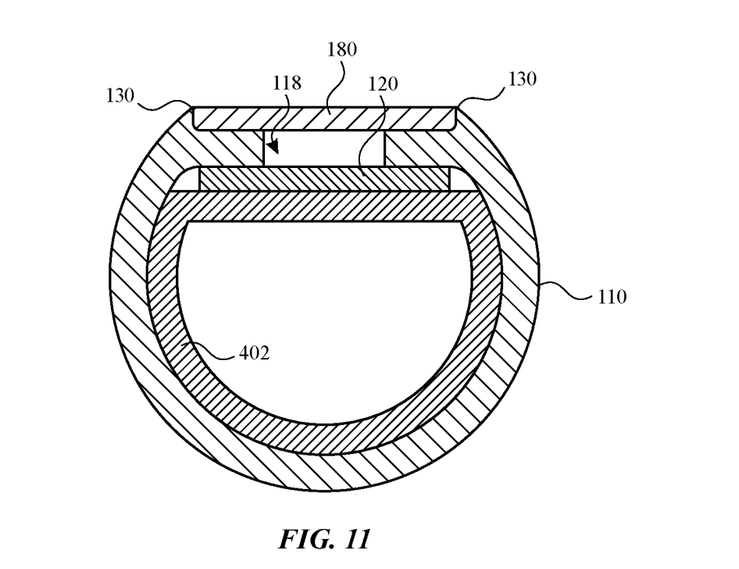
FIG. 11 illustrates a simplified front sectional view of the section B-B of another implementation of the stylus of FIG. 7, according to some embodiments of the subject technology.

Referring now to FIG. 11, the glass member can provide a view to a display or other visual element within the housing. For example, as shown in FIG. 11, the housing 110 can contain a display 120 that is supported on the frame 402. The gap 118 can separate the glass member 180 from the display 120, or no gap can be present. The display 120 can be viewed from outside the stylus through the glass member 180. The display 120 can be a visual output element, such as a liquid crystal display screen, electronic ink (e-ink) screen, organic light emitting diode (OLED) or diodes, light emitting diode or diodes, or the like. Where the display 120 provides a curvature, a flexible OLED screen can optionally be provided to conform to the desired shape. The display 120 can include a plate having perforations for selective illumination there through for displaying a pattern or design. Other components of the stylus 100, such as a touch sensor, can be positioned radially between the display 120 and the glass member 180. Additionally or alternatively, the display 120 can include or be placed adjacent to a diffuser or other element for modifying the visual output of the display 120.

Figure 12:
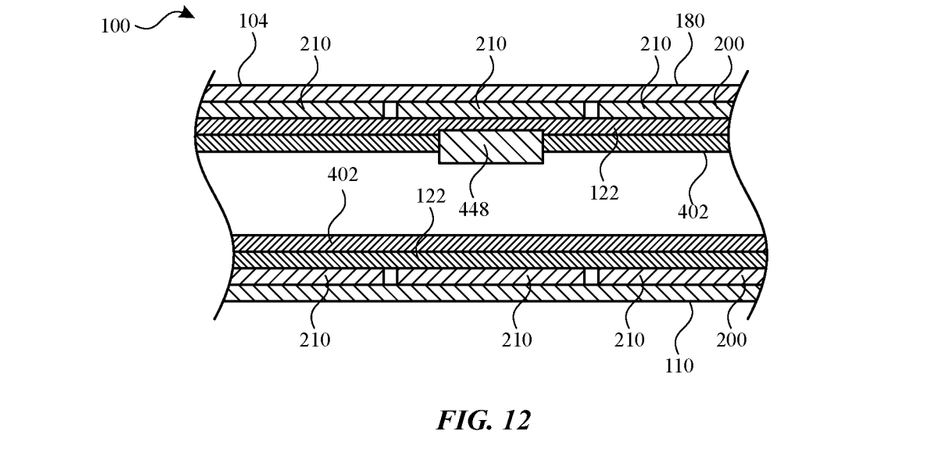
FIG. 12 illustrates a side sectional view of the section A-A of the stylus of FIG. 7, according to some embodiments of the subject technology.
Figure 13:
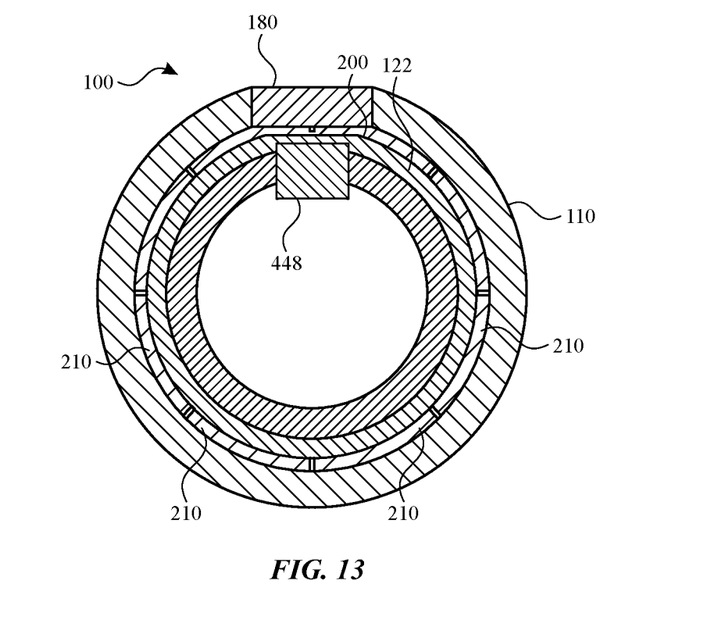
FIG. 13 illustrates a front sectional view of the section B-B of the stylus of FIG. 7, according to some embodiments of the subject technology.

Referring now to FIGS. 12 and 13, the stylus 100 can receive tactile input from the user at the user grip region 104 with a touch sensor 200. FIG. 12 illustrates a side sectional view of the stylus 100 taken along line A-A of FIG. 7, according to some embodiments of the subject technology. FIG. 13 illustrates a front sectional view of the stylus 100 taken along line B-B of FIG. 7, according to some embodiments of the subject technology. As shown in FIGS. 12 and 13, the stylus 100 can include a front magnet 448 that is within the frame 402. A similar arrangement can be provided for the rear magnet 498 discussed above. The position of the magnets on the same radial side as the glass member 180 allows engagement with the host device to be provided against the glass member 180, rather than the housing 110.

As shown in FIG. 12, the touch sensor 200 can include multiple sensing elements 210 distributed along a longitudinal length of the stylus 100 at the grip region 104. For example, the sensing elements 210 shown in FIG. 12 are distributed longitudinally so that each sensing element 210 of a given column faces outwardly at a different portion of the housing 110 and/or the glass member 180. The touch sensor 200 can include 1, 2, 3, 4, 5, 6, 7, 8, 9, 10, or more than 10 sensing elements 210 along a longitudinal length. The distribution of sensing elements 210 provides independent sensing capabilities at multiple locations along the longitudinal length of the stylus 100 at the grip region 104.

As shown in FIG. 13, the touch sensor 200 can be positioned radially between a frame 402 and the housing 110 and/or the glass member 180 of the stylus 100. In addition, an elastic insert 122 can be positioned between the touch sensor 200 and the frame 402. With the elastic insert 122 positioned radially between the frame 402 and the touch sensor 200, the elastic insert 122 can bias the touch sensor 200 radially outwardly against the housing 110 and/or the glass member 180.

The touch sensor 200 can include multiple sensing elements 210 distributed circumferentially. For example, the sensing elements 210 shown in FIG. 13 are distributed circumferentially so that each sensing element 210 of a given row faces radially outwardly at a different portion of the housing 110 and/or the glass member 180. The touch sensor 200 can include 1, 2, 3, 4, 5, 6, 7, 8, 9, 10, or more than 10 sensing elements 210 about a circumference. The distribution of sensing elements 210 provides independent sensing capabilities at multiple locations about the circumference of the stylus 100 at the grip region 104.

As shown in FIG. 13, the housing 110 and/or the glass member 180 can be curved along some or all of an inner and/or outer surface. The housing 110 and/or the glass member 180 can be flat along some or all of an inner and/or outer surface. The touch sensor 200 can generally conform to the outer shape of the frame 402 and/or the elastic insert 122. Additionally or alternatively, the touch sensor 200 can generally conform to the inner shape of the housing 110 and/or the glass member 180, which may include flat and/or curved surfaces. Where the touch sensor 200 does not directly contact the inner surface of the housing 110 and/or the glass member 180, the touch sensor 200 can maintain a constant distance with respect the most adjacent portions of the housing 110 and/or the glass member 180, so that the presence of a finger on the housing 110 and/or the glass member 180 is reliably detectable by the touch sensor 200.

Figure 14:
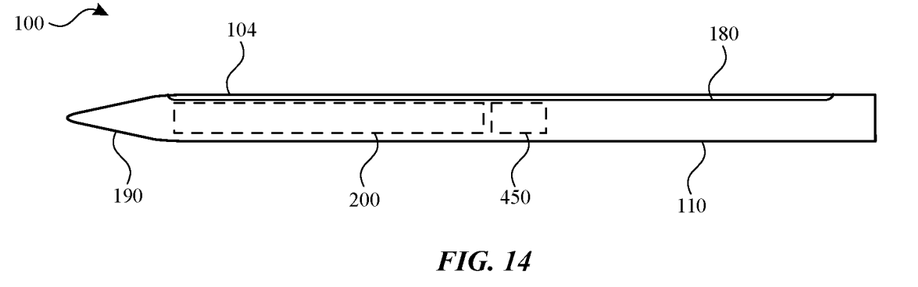
FIG. 14 illustrates a side view of a stylus, according to some embodiments of the subject technology.

As shown in FIG. 14, the touch sensor 200 can extend at least partially within a grip region 104 of the stylus 100 on a longitudinal side of the wireless power receiver 450. For example, the touch sensor 200 can extend along the grip region 104. The touch sensor 200 and the wireless power receiver 450 can be positioned along the longitudinal axis to have no overlapping portions. The touch sensor 200 can have a length that is within a length of the glass member 180.

Figure 15:
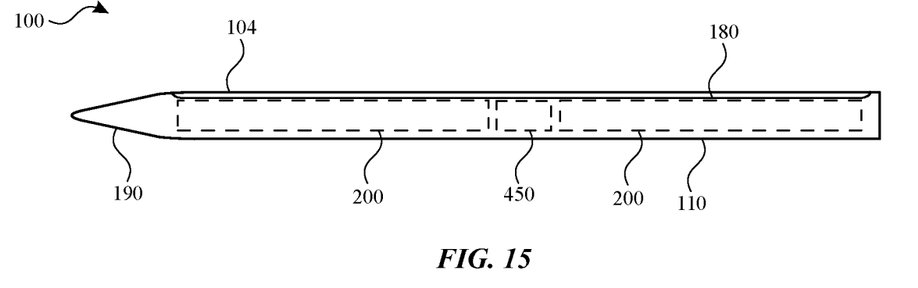
FIG. 15 illustrates a side view of a stylus, according to some embodiments of the subject technology.

As shown in FIG. 15, the stylus 100 can include multiple touch sensors 200 on opposite sides of the wireless power receiver 450. Each of the multiple touch sensors 200 can extend within a different portion of the housing 110. The touch sensors 200 can be spaced apart from each other. At least one of the touch sensors 200 can extend along the grip region 104. The touch sensors 200 and the wireless power receiver 450 can be positioned along the longitudinal axis to have no overlapping portions. Gestures detected by the separate touch sensors 200 can be interpreted as different user inputs according to preprogrammed functions to be performed by the stylus 100 and/or a host device upon detection of the user gestures. One or more of the touch sensors 200 can have a length that is within a length of the glass member 180.

Figure 16:
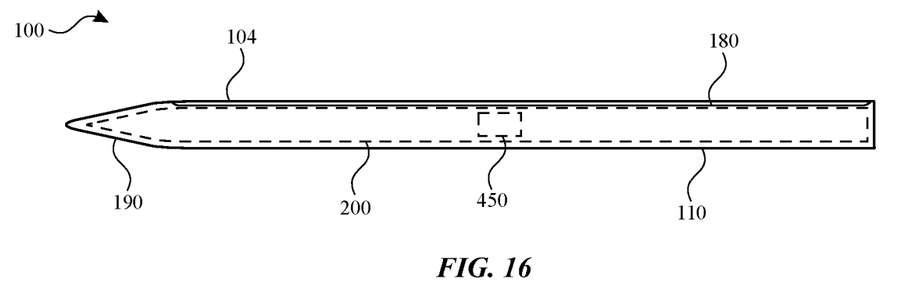
FIG. 16 illustrates a side view of a stylus, according to some embodiments of the subject technology.

As shown in FIG. 16, a touch sensor 200 can be positioned to extend across the wireless power receiver 450. In this configuration, the wireless power receiver 450 can be configured to operate through the touch sensor 200 and the glass member 180. In particular, charging can be performed when the stylus is not in use, and the touch sensor 200 can be deactivated during a charging session. The touch sensor 200 can have a length extends beyond a length of the glass member 180.

The touch sensor 200 can be provided to cause the stylus and/or the host device to perform one or more functions. While certain examples are provided herein, it will be appreciated that any function of the stylus and/or the host device can be performed according to preprogrammed features of the stylus and/or the host device. The touch sensor 200 can be used to detect where and whether the user is gripping the stylus 100. The touch sensor 200 can be used to change, select, and/or display one or more settings of the stylus and/or the host device. For example, the touch sensor 200 can detect gestures and transmit a signal to the host device to change, select, and/or display one or more settings that affect performance of the stylus and/or the host device. The setting can relate to a characteristic (e.g., color, size, width, thickness, shape, etc.) of a marking produced by use of the stylus with the host device The touch sensor 200 can be used to detect a tap, double tap, triple tap, or another tap gesture by the user. For example, as a user applies a finger at the grip region 104, the stylus 100 can detect the resulting capacitance that is induced in the touch sensor 200. The user can subsequently lift the finger, and the stylus 100 can detect the resulting capacitance or change in capacitance that is induced in the touch sensor 200. The user can subsequently return the finger to the grip region 104, and the stylus 100 can detect the resulting capacitance or change in capacitance that is induced in the touch sensor 200. The sequence of inputs within a span of time can be interpreted by the stylus 100 as a user's tap gesture. Additionally or alternatively, the touch sensor 200 can be used to detect a sliding gesture by the user. Multiple sensing elements of the touch sensor 200 along the grip region can be used in concert to detect particular user inputs. Additionally or alternatively, the touch sensor 200 can be used to detect a rolling gesture by the user. The rolling gesture can include movement of a finger about a circumference of the stylus 100 and/or rolling movement of the stylus 100 over a surface, such as a working surface. It will be appreciated that the touch sensor 200 can be used to detect combinations of gestures, including tap gestures, sliding gestures, rotational gestures, and/or other gestures. For example a sequence of different gestures in combination can be interpreted by the stylus 100 as a user's input.

The stylus 100 can be assembled by a process that provides the touch sensor 200 at a grip region 104 of the stylus 100 with the front magnet 448 supported there within. For example, the touch sensor 200 and the elastic insert 122 can be provided in a flat or substantially planar configuration. The elastic insert 122 can be wrapped around the frame 402. The recesses of the elastic insert can be aligned with protruding features of the frame assembly. The touch sensor 200 can be wrapped around the elastic insert 122. Next, the assembly including the front frame 402, the front magnet 448, the elastic insert 122, and the touch sensor 200 can be inserted into the housing 110 and near the glass member 180. Prior to being inserted, the assembly can be oversized such that an outer cross-sectional dimension (e.g. diameter) of the touch sensor 200 is greater than an inner cross-sectional dimension (e.g., diameter) of the housing 110. Accordingly, as the assembled touch sensor 200 is inserted into the housing 110, it will be compressed to conform to the inner surface of the housing 110 and/or the glass member 180. The touch sensor 200 can compress along with the elastic insert 122 when inserted into the housing 110. While within the housing 110, the elastic insert 122, under compression, biases the touch sensor 200 against the inner surface of the housing 110 and/or the glass member 180. The elastic insert 122 can include one or more of a variety of materials to provide such biasing under compression. For example, the elastic insert 122 can include a foam body, an elastomer, a matrix material, or another material having elastic properties. The elastic insert 122 can include an adhesive for bonding the touch sensor to the frame 402. For example, the elastic insert 122 can include a pressure-sensitive adhesive that is activated upon compression.

Figure 17:
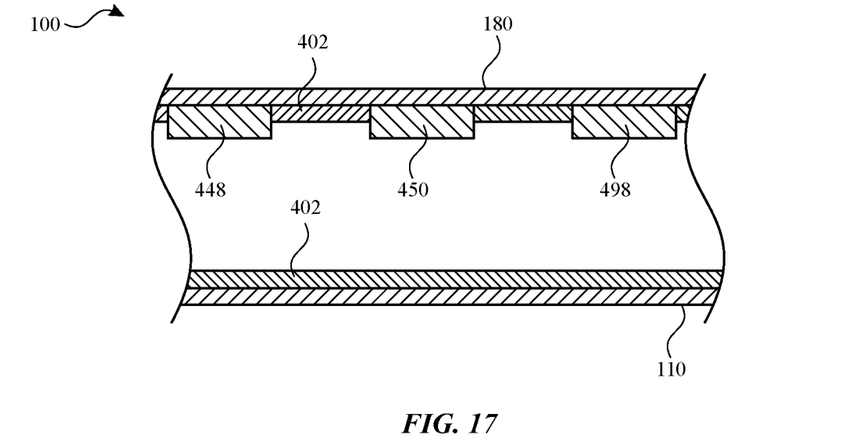
FIG. 17 illustrates a side sectional view of the section C-C of the stylus of FIG. 7, according to some embodiments of the subject technology.
Figure 18:
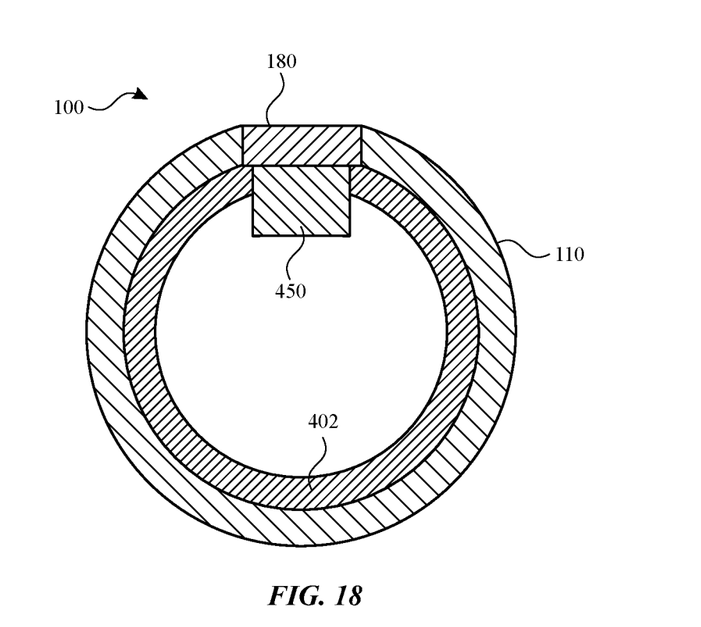
FIG. 18 illustrates a front sectional view of the section D-D of the stylus of FIG. 7, according to some embodiments of the subject technology.

Referring now to FIGS. 17 and 18, the stylus 100 can provide wireless charging capabilities. FIG. 17 illustrates a side sectional view of the stylus 100 taken along line C-C of FIG. 7, according to some embodiments of the subject technology. FIG. 17 illustrates a front sectional view of the stylus 100 taken along line D-D of FIG. 7, according to some embodiments of the subject technology. As shown in FIGS. 17 and 18, the stylus 100 can include a wireless power receiver 450 that is within the housing 110. The wireless power receiver 450 can be positioned on the same radial side as the glass member 180. The frame 402 can be of a metallic and/or conductive material that provides adequate structural support and shielding to components housed therein. The wireless power receiver 450 can be positioned near or adjacent to the glass member for electromagnetic power transfer through the glass member 180.

Figure 19:
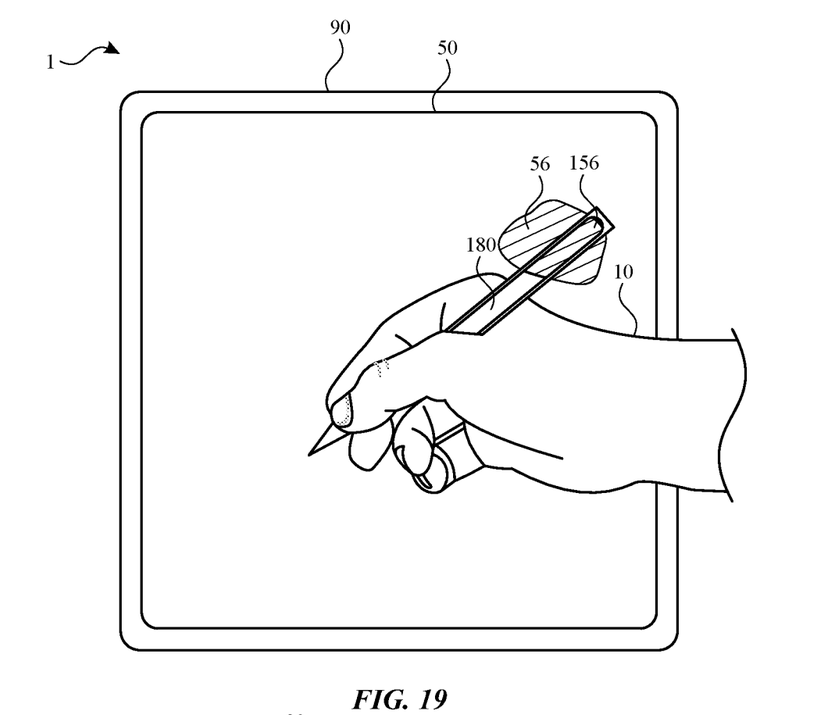
FIG. 19 illustrates a view of a system including a stylus and a host device, according to some embodiments of the subject technology.
Figure 20:
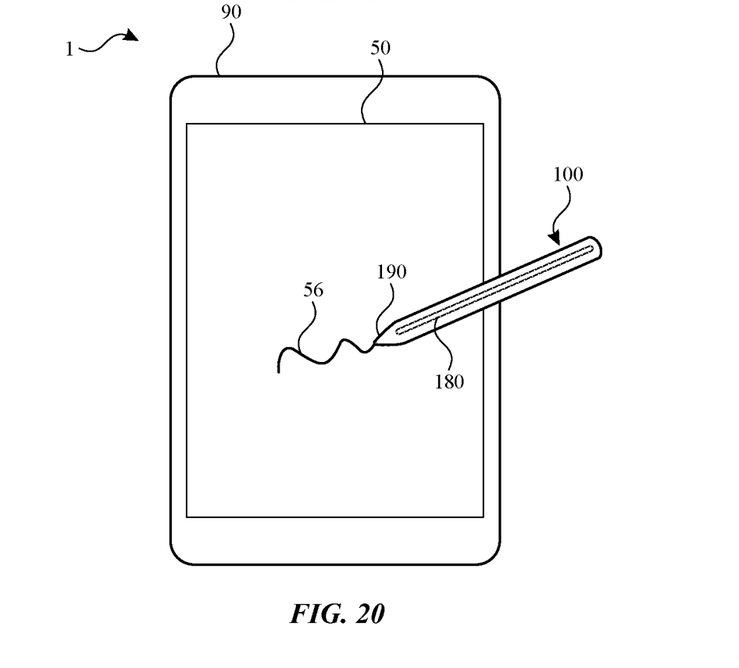
FIG. 20 illustrates a view of a system including a stylus and a host device, according to some embodiments of the subject technology.

FIGS. 19 and 20 illustrate some of the various operations of a stylus to display information relating to use with a host device. According to some embodiments, a stylus can replicate the display of a representation that is also displayed on the host device. For example, while the interface surface 50 of the host device 90 displays a representation 56, the stylus 100, through the glass member 180, can replicate at least a portion of the representation 56 as another representation 156. The stylus 100 and/or the host device 90 can estimate what portion of the glass member 180 is between the user and the displayed representation 56. Such an estimate can be based on the position and/or orientation of the stylus 100 and/or the host device 90. Corresponding sensors can be provided to perform such estimates. The resulting representation 156 displayed through the glass member 180 can give the appearance of the underlying representation 56 so the user is able to see the portion of the representation 56 that is otherwise blocked from user by the stylus 100.

According to some embodiments, the stylus can display a color, pattern, or other visual feature for output on the host device base on operation of the stylus. For example, a color can be selected. In some example, the stylus 100 can be used to select the color. The stylus 100 can transmit the color to the host device 90. The host device 90 records the color, and a corresponding signal is communicated to the display of the stylus for display to a user through the glass member 180. For example, a display beneath the glass member 180 can show one of more selected colors. As shown in FIG. 20, the tip 190 of the stylus 100 can be used to contact the interface surface 50 of the host device 90. A corresponding representation 56 is recorded and displayed on the interface surface 50 at the location of the tip 190. According to some embodiments, the selected and displayed color can be applied to the representation 56 that is displayed on the host device 90. Thus, the same color can be displayed through the glass member 180 of the stylus 100 and applied to the representation 56 that is displayed on the host device 90.

While portions of the above description relate to selection of color, it will be recognized that other characteristics, including other visual aspects, can be selected, displayed, and applied. For example, the selection, display, and application can relate to a brightness, opacity, shading, gradient, texture, size, proportion, and/or pattern.

Accordingly, the inclusion and arrangement of a glass member at an outer periphery of the stylus facilitates various functions of the stylus while providing structural support and aesthetic features. The glass member facilitates detection of touch input with a capacitive touch sensor within the stylus. The glass member facilitates magnetic coupling with a host device and wireless charging from the host device. The glass member also provides a durable outer surface along a section of the stylus to reduce the effects of wear. The glass member can be provided in a variety of shapes and arrangements that offer aesthetic options and customization for personal preferences.

While some embodiments of touch-based input devices disclosed herein relate to styluses, it will be appreciated that the subject technology can encompass and be applied to other input devices. For example, an input device in accordance with embodiments disclosed herein can include a phone, a tablet computing device, a mobile computing device, a watch, a laptop computing device, a mouse, a game controller, a remote control, a digital media player, and/or any other electronic device. Further, the host device can be any device that interacts with a touch-based input device. For example, a host device in accordance with embodiments disclosed herein can include a tablet, a phone, a laptop computing device, a desktop computing device, a wearable device, a mobile computing device, a tablet computing device, a display, a television, a phone, a digital media player, and/or any other electronic device.

Various functions described above can be implemented in digital electronic circuitry, in computer software, firmware or hardware. The techniques can be implemented using one or more computer program products. Programmable processors and computers can be included in or packaged as mobile devices. The processes and logic flows can be performed by one or more programmable processors and by one or more programmable logic circuitry. General and special purpose computing devices and storage devices can be interconnected through communication networks.

Some implementations include electronic components, such as microprocessors, storage and memory that store computer program instructions in a machine-readable or computer-readable medium (alternatively referred to as computer-readable storage media, machine-readable media, or machine-readable storage media). Some examples of such computer-readable media include RAM, ROM, read-only compact discs (CD-ROM), recordable compact discs (CD-R), rewritable compact discs (CD-RW), read-only digital versatile discs (e.g., DVD-ROM, dual-layer DVD-ROM), a variety of recordable/rewritable DVDs (e.g., DVD-RAM, DVD-RW, DVD+RW, etc.), flash memory (e.g., SD cards, mini-SD cards, micro-SD cards, etc.), magnetic and/or solid state hard drives, ultra density optical discs, any other optical or magnetic media, and floppy disks. The computer-readable media can store a computer program that is executable by at least one processing unit and includes sets of instructions for performing various operations. Examples of computer programs or computer code include machine code, such as is produced by a compiler, and files including higher-level code that are executed by a computer, an electronic component, or a microprocessor using an interpreter.

While the above discussion primarily refers to microprocessor or multi-core processors that execute software, some implementations are performed by one or more integrated circuits, such as application specific integrated circuits (ASICs) or field programmable gate arrays (FPGAs). In some implementations, such integrated circuits execute instructions that are stored on the circuit itself.

As used in this specification and any claims of this application, the terms "computer", "processor", and "memory" all refer to electronic or other technological devices. These terms exclude people or groups of people. For the purposes of the specification, the terms "display" or "displaying" means displaying on an electronic device. As used in this specification and any claims of this application, the terms "computer readable medium" and "computer readable media" are entirely restricted to tangible, physical objects that store information in a form that is readable by a computer. These terms exclude any wireless signals, wired download signals, and any other ephemeral signals.

To provide for interaction with a user, implementations of the subject matter described in this specification can be implemented on a computer having a display device as described herein for displaying information to the user and a keyboard and a pointing device, such as a mouse or a trackball, by which the user can provide input to the computer. Other kinds of devices can be used to provide for interaction with a user as well; for example, feedback provided to the user can be any form of sensory feedback, such as visual feedback, auditory feedback, or tactile feedback; and input from the user can be received in any form, including acoustic, speech, or tactile input.

Many of the above-described features and applications are implemented as software processes that are specified as a set of instructions recorded on a computer readable storage medium (also referred to as computer readable medium). When these instructions are executed by one or more processing unit(s) (e.g., one or more processors, cores of processors, or other processing units), they cause the processing unit(s) to perform the actions indicated in the instructions. Examples of computer readable media include, but are not limited to, CD-ROMs, flash drives, RAM chips, hard drives, EPROMs, etc. The computer readable media does not include carrier waves and electronic signals passing wirelessly or over wired connections.

In this specification, the term "software" is meant to include firmware residing in read-only memory or applications stored in magnetic storage, which can be read into memory for processing by a processor. Also, in some implementations, multiple software aspects of the subject disclosure can be implemented as sub-parts of a larger program while remaining distinct software aspects of the subject disclosure. In some implementations, multiple software aspects can also be implemented as separate programs. Finally, any combination of separate programs that together implement a software aspect described here is within the scope of the subject disclosure. In some implementations, the software programs, when installed to operate on one or more electronic systems, define one or more specific machine implementations that execute and perform the operations of the software programs.

A computer program (also known as a program, software, software application, script, or code) can be written in any form of programming language, including compiled or interpreted languages, declarative or procedural languages, and it can be deployed in any form, including as a stand-alone program or as a module, component, subroutine, object, or other unit suitable for use in a computing environment. A computer program may, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

It is understood that any specific order or hierarchy of blocks in the processes disclosed is an illustration of example approaches. Based upon design preferences, it is understood that the specific order or hierarchy of blocks in the processes may be rearranged, or that all illustrated blocks be performed. Some of the blocks may be performed simultaneously. For example, in certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

The predicate words "configured to", "operable to", and "programmed to" do not imply any particular tangible or intangible modification of a subject, but, rather, are intended to be used interchangeably. For example, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code A phrase such as an "aspect" does not imply that such aspect is essential to the subject technology or that such aspect applies to all configurations of the subject technology. A disclosure relating to an aspect may apply to all configurations, or one or more configurations. A phrase such as an aspect may refer to one or more aspects and vice versa. A phrase such as a "configuration" does not imply that such configuration is essential to the subject technology or that such configuration applies to all configurations of the subject technology. A disclosure relating to a configuration may apply to all configurations, or one or more configurations. A phrase such as a configuration may refer to one or more configurations and vice versa.

The word "example" is used herein to mean "serving as an example or illustration." Any aspect or design described herein as "example" is not necessarily to be construed as preferred or advantageous over other aspects or design All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for." Furthermore, to the extent that the term "include," "have," or the like is used in the description or the claims, such term is intended to be inclusive in a manner similar to the term "comprise" as "comprise" is interpreted when employed as a transitional word in a claim.

What is claimed is:
1. A stylus comprising:
a housing defining a first ledge and a second ledge, wherein the first ledge and the second ledge are separated by a gap;

a glass member on a side of the housing and defining a portion of an outer periphery of the stylus, the glass member being supported on the first ledge and the second ledge; and a wireless power receiver within the housing on a same radial side of the stylus as the glass member.

2. The stylus of claim 1, further comprising:
a first stylus magnet on the same radial side of the stylus as the glass member; and
a second stylus magnet on the same radial side of the stylus as the glass member, wherein when the first and second stylus magnets are aligned with host magnets of a host device, the wireless power receiver is aligned with a wireless power transmitter of the host device.

3. The stylus of claim 1, further comprising a display within the housing and being visible through the glass member.

4. The stylus of claim 1, wherein the housing and the glass member define a grip region of the stylus, the stylus further comprising a capacitive touch sensor comprising multiple sensing elements distributed circumferentially and longitudinally along an inner surface of the housing at the grip region.

5. The stylus of claim 1, further comprising:
a tip moveable with respect to the housing; and
a force sensor configured to indicate when a force is applied to the tip.

6. The stylus of claim 1, wherein the housing defines, in cross-section, a continuously curved outer surface terminating in housing edges, and the glass member forms an outer surface that is flush with the housing edges and includes a flat outer surface.

7. A stylus comprising:
a housing defining a first ledge and a second ledge, wherein the first ledge and the second ledge are separated by a gap;
a glass member on a side of the housing and forming a flat outer surface extending along a length of the stylus, the glass member being supported on the first ledge and the second ledge; and
multiple stylus magnets for magnetically coupling to corresponding host magnets of a host device, the stylus magnets being within the housing on a same radial side of the stylus as the glass member.

8. The stylus of claim 7, wherein when the stylus magnets are coupled to the host magnets, the glass member abuts the host device.

9. The stylus of claim 7, wherein when the stylus magnets are aligned with the host magnets a wireless power receiver of the stylus is aligned with a wireless power transmitter of the host device.

10. The stylus of claim 7, further comprising a display within the housing and being visible through the glass member.

11. The stylus of claim 7, wherein the housing and the glass member define a grip region of the stylus, the stylus further comprising:
a frame;
an elastic insert positioned about the frame; and
a capacitive touch sensor positioned about the elastic insert and comprising multiple sensing elements distributed circumferentially and longitudinally along an inner surface of the housing at the grip region, wherein the capacitive touch sensor is positioned radially between one of the stylus magnets and the glass member.

12. The stylus of claim 7, further comprising:
a tip moveable with respect to the housing; and
a force sensor configured to indicate when a force is applied to the tip.

13. The stylus of claim 7, wherein the housing defines, in cross-section, a continuously curved outer surface terminating in housing edges, and the glass member forms an outer surface that is flush with the housing edges and includes a flat outer surface.

14. A stylus comprising:
a housing defining, in cross-section, a continuously curved outer surface terminating in housing edges, the housing defining:
a first shoulder and a second shoulder; and
a support surface extending between the first shoulder and the second shoulder; and
a glass member on a side of the housing and forming an outer surface that is flush with the housing edges and includes a flat portion, the glass member being supported on the support surface and between the first shoulder and the second shoulder.

15. The stylus of claim 14, wherein the housing further defines
a first ledge and a second ledge, wherein the glass member is supported on the first ledge and the second ledge and between the first shoulder and the second shoulder, wherein the first ledge and the second ledge are separated by a gap.

16. The stylus of claim 14, wherein the glass member is nested within a recess of the housing.

17. The stylus of claim 14, further comprising a display within the housing and being visible through the glass member.

18. The stylus of claim 17, wherein the housing and the glass member define a grip region of the stylus, the stylus further comprising a capacitive touch sensor comprising multiple sensing elements distributed circumferentially and longitudinally along an inner surface of the housing at the grip region, wherein the capacitive touch sensor is positioned radially between the display and the glass member.

* * * * *